United States Patent [19]

Shiraishi et al.

[11] Patent Number: 5,441,849
[45] Date of Patent: Aug. 15, 1995

[54] METHOD OF FORMING PATTERN AND MAKING SEMICONDUCTOR DEVICE USING RADIATION-INDUCED CONDUCTIVE RESIN BOTTOM RESIST LAYER

[75] Inventors: Hiroshi Shiraishi; Takumi Ueno, both of Hachioji; Fumio Murai, Tokyo; Hajime Hayakawa, Kunitachi; Asao Isobe, Hitachi, all of Japan

[73] Assignees: Hitachi, Ltd.; Hitachi Chemical Company, both of Tokyo, Japan

[21] Appl. No.: 117,969

[22] Filed: Sep. 8, 1993

Related U.S. Application Data

[60] Continuation of Ser. No. 908,746, Jul. 6, 1992, abandoned, which is a continuation of Ser. No. 686,448, Apr. 17, 1991, abandoned, which is a division of Ser. No. 377,375, Jul. 10, 1989, abandoned.

[30] Foreign Application Priority Data

Jul. 11, 1988 [JP] Japan .................................. 63-170953

[51] Int. Cl.⁶ .......................... G03C 5/00; B44C 1/22
[52] U.S. Cl. ..................................... 430/296; 430/271; 430/313; 430/317; 430/318; 430/323; 430/944; 430/967; 430/325; 216/47; 216/48; 216/51; 216/13; 216/67; 156/643.1
[58] Field of Search ............... 430/271, 296, 323, 967, 430/944, 313, 317, 318

[56] References Cited

U.S. PATENT DOCUMENTS

| | | | |
|---|---|---|---|
| 4,287,277 | 9/1981 | Matsumoto et al. | 430/270 X |
| 4,463,265 | 7/1984 | Owen et al. | 430/296 X |
| 4,702,993 | 10/1987 | White et al. | 430/296 |

FOREIGN PATENT DOCUMENTS

| | | |
|---|---|---|
| 57-096333 | 6/1982 | Japan . |
| 57-96333 | 6/1982 | Japan .................. 430/296 |
| 59-116745 | 7/1984 | Japan .................. 430/296 |
| 60-103342 | 6/1985 | Japan . |
| 60-117241 | 6/1985 | Japan . |
| 57-185037 | 11/1985 | Japan . |
| 60-258555 | 12/1985 | Japan . |
| 63-56655 | 3/1988 | Japan . |

OTHER PUBLICATIONS

European Search Report completed on Mar. 11, 1991 in The Hague, by Examiner U. P. Haenisch, citing 5 references contained herein (2 pages).
Annex to European Search Report citing U.S. Patent No. 4,702,993.
Database WPIL, No. 88-177833, Derwent Publications Ltd., London, GB.

*Primary Examiner*—Marion E. McCamish
*Assistant Examiner*—Bernard Codd
*Attorney, Agent, or Firm*—Pennie & Edmonds

[57] ABSTRACT

Electrical charge accumulation caused by exposure to a charged particle beam during the formation of latent image pattern can be reduced and thus the positional deviation of the pattern by using a bottom-resist layer comprising a radiation-induced conductive composition. Highly integrated semiconductor device can be made easily and in high yields. The positional deviation can further be reduced by exposing a charge particle beam patterning apparatus substantially simultaneously with an actinic radiation such as ultraviolet light, X-ray, and infrared light.

22 Claims, 1 Drawing Sheet

METHOD OF FORMING PATTERN AND MAKING SEMICONDUCTOR DEVICE USING RADIATION-INDUCED CONDUCTIVE RESIN BOTTOM RESIST LAYER

This is a continuation of application Ser. No. 908,746, filed Jul. 6, 1992, now abandoned, which is a continuation of application Ser. No. 07/686,448, filed Apr. 17, 1991, now abandoned, which is a divisional of application Ser No. 07/377,375, filed Jul. 10, 1989, now abandoned.

BACKGROUND

The present invention relates to a method of pattern formation and making a semiconductor using a radiation-induced conductive resin bottom-resist layer.

In making a highly integrated circuit, the so-called multi-layer resist process is employed. In the multi-layer resist process, an organic resin having a high dry etching resistance is used as a bottom-resist layer to smooth the surface to be processed and to increase the dry etching resistance of the surface. However, most of the prior organic resin layers are insulators, i.e., non-conducting. As a result, when the non-conducting organic resin bottom-resist layer is exposed to an electron beam exposure during the patterning step, an electrical charge is accumulated in the bottom-resist layer. This causes a turbulence of the electric field on the surface of the substrate. Accordingly, a highly accurate pattern cannot be obtained.

Attempts have been made in the past to reduce this charge accumulation by using a bottom-resist layer having a mixture of a synthetic resin superior in dry etching resistance and a complex salt of a polycation polymer, known as a conductive polymer, and tetracyanoquinodimethane (Japanese Patent Kokai No. 62-113135). Since the bottom layer must have a sufficient dry etching resistance and the conductive polymer alone cannot be used as a bottom-resist layer, the conductive polymer is mixed with the synthetic resin superior in dry etching resistance to simply improve the conductivity.

However, the conductivity of the bottom-resist layer composition obtained by the above process ranges only from $10^{12}$ to $10^{15}$ S.cm$^{-1}$, which is nearly the same as that of a silicate glass known as an insulator. Thus, the improvement is considerably limited.

The prior art bottom-resist layer accordingly does not possess ideal properties, namely, the properties of both the high dry etching resistance and the conductivity.

SUMMARY OF THE INVENTION

According to the present invention, a radiation-induced conductive resin is used as a bottom-resist layer to reduce the electrical charge accumulation caused by an exposure thereof to a charged particle beam, thereby reducing the positional deviation of the pattern. By using the radiation-induced conductive resin bottom-resist layer and grounding the bottom-resist layer during a latent image pattern formation step, patterns of high accuracy can be produced.

The radiation-induced conductive resin compositions according to the present invention can be formed from various photo-conductive resin compositions, such as photoconductive polymers having many $\pi$-electrons in side chains such as poly-N-vinylcarbazole and derivatives thereof such as poly-N-vinylbromocarbazole, poly-N-vinyldibromocarbazole, poly-2-vinylcarbazole, poly-3-vinylcarbazole, and copolymers thereof, poly-1-vinylnaphthalene, polyacenaphthylene, polyvinylphenanthrene, polyvinylacridine and polyvinylpyrene, and mixtures of these photoconductive polymers with additives for improvement of photoconductivity. Polymers having many $\pi$-electrons, for example, 10 to 16 $\pi$-electrons, in side chains generally have a high dry etching resistance, and thus can be used as a bottom-resist layer.

The present invention also contemplates using a charged particle beam patterning apparatus capable of also irradiating an actinic radiation substantially simultaneously with the charged particle beam. The charged particle beams used for formation of patterns include an electron beam. The actinic radiation include electromagnetic radiations having no effect on the charged particle beam such as an ultraviolet light, X-ray, and an infrared light. The actinic radiation as previously indicated is irradiated substantially simultaneously with the charged particle beam to further excite the bottom-resist layer to improve the conductivity.

When a radiation-induced conductive composition is included in the bottom-resist layer, it becomes conductive upon irradiation with the charged particle beams and/or actinic radiation. Therefore, when a top-resist layer, where a latent image pattern is formed, is irradiated, the bottom-layer also becomes irradiated and becomes conductive. Thus, when the bottom-resist layer is in contact with a grounded conductive layer, the charge accumulation induced in the top-resist layer is rapidly dissipated. As a result, it becomes possible to minimize the positional deviation of the desired position to be irradiated, caused by an electric field produced by the charge accumulation in the resist layer.

The photoconductive polymers having many $\pi$-electrons in side chains can be used, as they are, as the radiation-induced conductive film, but various additives are preferably added when they are used as a bottom-resist layer. That is, for example, a middle-resist or top-resist layer is typically formed on the bottom-resist layer by spin coating and so the bottom-layer resist must be insoluble in the solvent used for the coating. Thus, it is effective to cross-link the radiation-induced conductive resin layer by incorporating a compound or a resin having a cross-linking reactivity to insolubilize the bottom-resist layer. It is also effective to use additives which can, in association with the photoconductive polymer having many $\pi$-electrons in side chains, accelerate the radiation-induced conductivity of this photoconductive polymer. Furthermore, it is effective to include radiation-induced luminescent compounds or surfactants for improving the coatability. In this connection, it is effective to use 10–70% by weight of the additives. Above 70% by weight, the radiation-induced conductivity and the coatability deteriorate. It is also effective to use additives which can, in association with the photoconductive polymer having many $\pi$-electrons in side chain, accelerate radiation-induced conductivity of this photoconductive polymer.

Furthermore, it is effective to include radiation-induced luminescent compounds or surfactants for improving coatability. In this connection, it is effective to use 10 to 70% by weight of the radiation-induced luminescent compounds. Above 70% by weight, the radiation-induced conductivity and the coatability deteriorates.

In addition, since a photoconductive composition can be used as a radiation-induced conductive composition, the conductivity of the bottom resist layer at the time of formation of pattern latent image can be further improved and the ability to dissipate charge accumulation in the top-resist layer can be further improved by adding to the charged particle beam an actinic radiation which can sufficiently excite radiation-induced conductive composition by simultaneously irradiating with the charged particle beam for formation of a latent image.

As explained above, according to the resist composition and the method for production of the present invention, problems in conventional techniques have been solved and charge accumulation phenomenon in resist films during charged particle beam patterning can be reduced to improve the accuracy of the pattern position. Thus, a highly integrated semiconductor device can be obtained and in high yields according to the present invention.

Furthermore, according to the present invention, it is enough to form a layer of radiation-induced conductive resin composition as a bottom-resist layer.

DETAILED DESCRIPTION OF PREFERRED EMBODIMENTS

The present invention is explained in more detail by the following Examples:

EXAMPLE 1

Figure 1A:
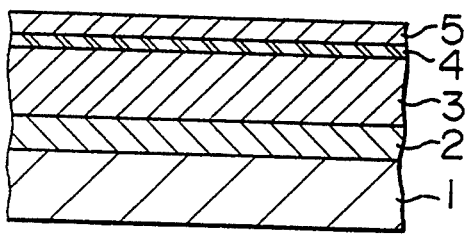
FIGS. 1 (a)–1(f) show various stages of a process for pattern formation according to the present invention.

FIG. 1(a) shows a cross-section of various layers prior to processing for forming a wiring layer. A coating of an aluminum film 2 (1 μm thick) was formed on a semiconductor substrate 1. A radiation-induced conductive resin film 3 (2.5 μm thick) was formed on the aluminum film 2 by spin-coating a cyclohexane solution of poly-N-vinylcarbazole prepared by cation polymerization and heat treating the coating at 230° C. for 20 minutes on a hot plate. Then, a spin-coatable silicate glass layer 4 was coated on the radiation-induced conductive resin film to a thickness of 0.1 μm, followed by heat treatment at 200° C. for 30 minutes. Then, a positive electron-beam resist RE5000P (trademark for resist of Hitachi Chemical Co., Ltd.) 5 was coated to a thickness of 0.5 μm.

Figure 1B:
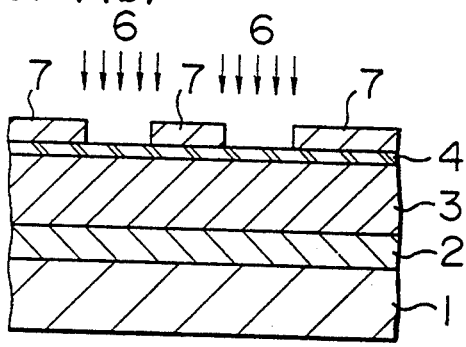

FIG. 1(b) shows the state where the resulting latent image of the top-resist layer 5 obtained in FIG. 1(a) was developed with an aqueous solution containing 2% by weight of tetramethylammonium hydroxide to obtain a top-resist layer pattern 7 after exposing to an electron-beam 6 at an acceleration voltage of 30 KV and a dose of 2 μm/cm² by a variable shaped beam type electron-beam lithography system.

Figure 1C:
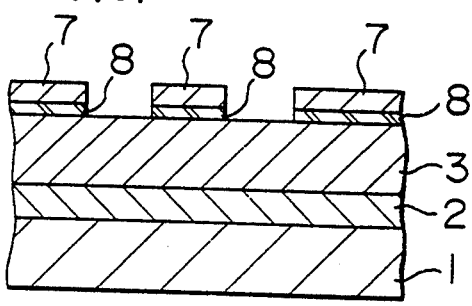

FIG. 1(c) shows the state where the spin-coatable silicate glass film 4 shown in FIG. 1(b) was subjected to etching in fluorine-containing plasma to obtain a silicate glass pattern 8 corresponding to the top-resist layer pattern.

Figure 1D:
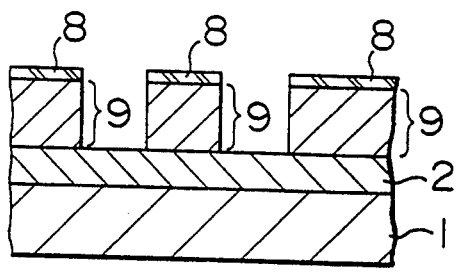

FIG. 1(d) shows the state where the radiation-induced conductive resin layer 3 of the substrate of FIG. 1(c) was subjected to reactive ion etching by oxygen plasma to obtain a bottom-resist layer pattern 9 corresponding to the silicate glass pattern 8.

Figure 1E:
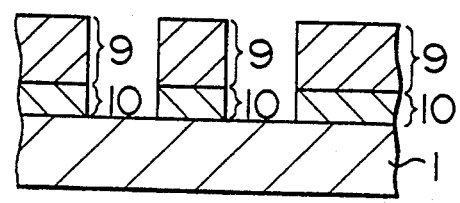

FIG. 1(e) shows the state where the spin-coatable silicate glass pattern 8 of the substrate of FIG. 1(d) was removed by dilute aqueous hydrofluoric acid solution and then aluminum film 2 etched by reactive ion etching with chlorine to obtain an aluminum wiring pattern 10.

Figure 1F:
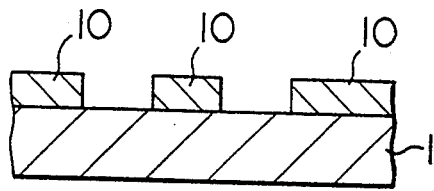

FIG. 1(f) shows the state where the unnecessary bottom-resist layer pattern 9 of the substrate of FIG. 1(e) was removed by oxygen plasma to form the aluminum wiring pattern 10.

As a comparative example, a sample was prepared by forming an aluminum wiring pattern on semiconductor base 1 in the same manner as above except that a resin layer of 2.5 μm thick obtained by coating a usual positive photoresist OFPR-800 (trademark for photoresist of Tokyo Oka Kogyo Co.) was used in place of the radiation-induced conductive resin and heat treated the coating at 230° C. for 30 minutes.

Deviation in position when irradiation of the electron-beam was deflected by 6 mm was measured on these two samples. The latter sample in which a usual positive photoresist was used showed a deviation in position of 0.5 μm while the former sample according to the present invention using the radiation-induced conductive resin composition showed a deviation in position of only 0.05 μm or less.

The dry etching resistance of the aluminum film when the radiation-induced conductive resin composition was used as the bottom-resist layer was equivalent to that of the aluminum film when a bottom-resist layer obtained by coating the OFPR-800 was used and heat treated at 230° C. for 30 minutes.

EXAMPLE 2

Example 1 was repeated except that formation of gate pattern was carried out using a polysilicon film in place of the aluminum wiring layer, thereby to obtain improvement in positional accuracy similar to that obtained in Example 1. In this case, etching of the polysilicon film was carried out by reactive ion etching with fluorine-containing plasma.

EXAMPLE 3

An aluminum wiring pattern was prepared in the same manner as in Example 1 except that the variable shaped beam type electron-beam lithography system used in Example 1 was remodeled to provide an ultraviolet ray projector in the patterning chamber and the surface of the sample substrate was exposed to an ultraviolet ray emitted from a low-pressure mercury lamp through a photo-guide during electron-beam patterning. Positional accuracy of this pattern was examined and found that the accuracy further improved to 0.04 μm or less in the positional deviation.

EXAMPLE 4

The film comprising only the poly-N-vinylcarbazole used as radiation-induced conductive resin layer in Example 1 had cracks on a part of the film surface after heat treatment. Therefore, for improving quality of the film surface, various additives were examined and as a result, it was found that when the following additives were used alone or in combination, the film after subjected to heat treatment at 230° C. for 20 minutes became insoluble in solvent without developing any cracks on the surface and thus the quality of the film was improved: Naphthoquinonediazide derivatives such as ester of 1,2-naphthoquinone-(2)-diazide-5-sulfonic acid with 2,3,4-trihydroxybenzophenone and ester of said naphthoquinonediazidesulfonic acid with 4,4'-dihydroxydiphenyl-(2)-propane, diazide compounds such as 1-(4-azidobenzylidene)-3-(α-hydroxy-4-azidobenzyl)indene, 4-4-diazidocalcone, and 2,6-bix(4'-azidobenzal)cyclohexane, and epoxy resins such as bisphenol-A type epoxy resin (D,E,R-661 manufactured by Dow Chemical Co.) and epoxy novolak resin (TACTIX-485 manufactured by Dow Chemical Co.). Some examples of compositions of these mixed films are shown in Table 1 in % by weight.

TABLE 1

|  | PVCz | NQD | EPX |
|---|---|---|---|
| Composition 1 | 90.0 | 10.0 | — |
| Composition 2 | 70.0 | 30.0 | — |
| Composition 3 | 50.0 | 50.0 | — |
| Composition 4 | 60.0 | 30.0 | 10.0 |
| Composition 5 | 50.0 | 25.0 | 25.0 |
| Composition 6 | 30.0 | 30.0 | 40.0 |

PVCz: Poly-N-vinylcarbazole.
NQD: 1,2-Naphthoquinone-(2)-diazide-5-sulfonic acid - 2,3,4-trihydroxybenzophenone ester.
EPX: Epoxy novolak resin TACTIX-485 manufactured by Dow Chemical Co.

Each of the compositions was dissolved in cyclohexanone to prepare coating solutions. An aluminum wiring layer was formed in the same manner as in Example 1 except that each of these coating solutions was used in place of PVCz cyclohexanone solution. All of the resulting samples showed remarkable improvement in positional accuracy as compared with the samples where heat treated film of the usual positive photo-resist was used as a bottom-resist layer.

In the above examples, explanation has been made with respect to a tri-layer construction in which a spin-coatable silicate glass was used as a middle-layer. However, the same effects were obtained when a silicon-containing-resist high in oxygen plasma resistance was used as a top-resist layer which forms a latent image pattern, without using the middle-layer.

What is claimed is:

1. A method of forming a pattern comprising the steps of:
   1) forming an electroconductive layer on a substrate;
   2) grounding said electroconductive layer;
   3) forming a cross-linked bottom resist layer composed of a radiation-induced conductive resin composition on said electroconductive layer;
   4) forming a top resist layer, which acts as a mask for said bottom resist layer, on said bottom resist layer;
   5) irradiating said top resist layer with an electron beam followed by development to form a patterned top resist layer;
   6) discharging the electric charges, which are generated by the irradiation of the electron beam, through said electroconductive layer; and
   7) patterning said bottom resist layer by etching said bottom resist layer using said patterned top resist layer as a mask.

2. A method according to claim 1, wherein said radiation-induced conductive resin composition of said bottom resist layer contains 10 to 70% by weight of an additive containing a cross-linking component.

3. A method according to claim 1, wherein said radiation-induced conductive resin composition comprises a vinyl polymer having at least one aromatic ring as a side chain, said at least one aromatic ring having 10–16 π-electrons.

4. A method according to claim 3, wherein said side chain is a carbazole ring.

5. A method according to claim 1, wherein said radiation-induced conductive resin composition is a photoconductive polymer having a plurality of π-electrons in side chain, selected from the group consisting of poly-N-vinylcarbazole, poly-N-vinylbromocarbazole, poly-N-vinyldibromocarbazole, poly-2-vinylcarbazole, poly-3-vinylcarbazole, and copolymers thereof, poly-1-vinylnaphthalene, polyacenaphthylene, polyvinylphenanthrene, polyvinylacridine and polyvinylpyrene, and mixtures thereof.

6. A method according to claim 1, wherein said top resist layer is a silicon-containing resist layer.

7. A method according to claim 1, wherein said bottom resist layer is patterned by reactive ion etching with oxygen plasma through said patterned top resist layer which acts as a mask.

8. A method according to claim 1, further comprising the step of heat treating said radiation-induced conductive resin composition.

9. A method according to claim 1, further comprising the step of irradiating said top layer resist with actinic radiation substantially simultaneously with said electron beam to increase conductivity of said bottom resist layer.

10. A method according to claim 9, wherein said actinic radiation is an electromagnetic radiation selected from the group consisting of ultraviolet light, X-ray and infrared light, which does not affect said electron beam.

11. A method according to claim 1, wherein a silicate glass layer is provided between said bottom resist layer and said top resist layer, further comprising the steps of:
   patterning said silicate glass layer by etching said silicate glass layer using said top resist layer as a mask;
   patterning said bottom resist layer by etching said bottom resist layer using said patterned silicate glass layer as a mask.

12. A method of forming a semiconductor device comprising the steps of:
   1) forming an electroconductive layer on a substrate;
   2) grounding said electroconductive layer;
   3) forming a cross-linked bottom resist layer composed of a radiation-induced conductive resin composition on said electroconductive layer;
   4) forming a top resist layer, which acts as a mask for said bottom resist layer, on said bottom resist layer;
   5) irradiating said top resist layer with an electron beam followed by development to form a patterned top resist layer;
   6) discharging the electric charges, which are generated by the irradiation of the electron beam, through said electroconductive layer;
   7) patterning said bottom resist layer by etching said bottom resist layer using said patterned top resist layer as a mask; and
   8) patterning said electroconductive layer by etching said electroconductive layer using said patterned bottom resist layer as a mask.

13. A method according to claim 12, wherein said radiation-induced conductive resin composition of said bottom resist layer contains 10 to 70% by weight of an additive containing a cross-linking component.

14. A method according to claim 12, wherein said bottom resist layer containing said radiation-induced conductive resin composition comprises a vinyl polymer having at least one aromatic ring as a side chain, said at least one aromatic ring having 10–16 π-electrons.

15. A method according to claim 14, wherein said side chain is a carbazole ring.

16. A method according to claim 12, wherein said radiation-induced conductive resin composition is a photoconductive polymer having a plurality of π-electrons in side chain, selected from the group consisting of poly-N-vinylcarbazole, poly-N-vinylbromocarbazole, poly-N-vinyldibromocarbazole, poly-2-vinylcarbazole, poly-3-vinylcarbazole, and copolymers thereof, poly-1-vinylnaphthalene, polyacenaphthylene, polyvinylphenanthrene, polyvinylacridine and polyvinylpyrene, and mixtures thereof.

17. A method according to claim 12, wherein said top resist layer is a silicon-containing resist layer.

18. A method according to claim 12, wherein said bottom resist layer is patterned by reactive ion etching with oxygen plasma through said patterned top resist layer which acts as a mask.

19. A method according to claim 12, further comprising the step of heat treating said radiation-induced conductive composition.

20. A method according to claim 12, further comprising the step of irradiating said top layer resist with actinic radiation substantially simultaneously with said electron beam to increase conductivity of said bottom resist layer.

21. A method according to claim 20, wherein said actinic radiation is an electromagnetic radiation selected from the group consisting of ultraviolet light, X-ray and infrared light, which does not affect said electron beam.

22. A method according to claim 12, wherein a silicate glass layer is provided between said bottom resist layer and said top resist layer, further comprising the steps of:
   patterning said silicate glass layer by etching said silicate glass layer using said top resist layer as a mask;
   patterning said bottom resist layer by etching said bottom resist layer using said patterned silicate glass layer as a mask.

* * * * *

UNITED STATES PATENT AND TRADEMARK OFFICE
CERTIFICATE OF CORRECTION

PATENT NO.   :   5,441,849

DATED   :   August 15, 1995

INVENTOR(S)   :   SHIRAISHI et al.

It is certified that error appears in the above-identified patent and that said Letters Patent is hereby corrected as shown below:

TITLE PAGE, [73] Assignees:

change "Hitachi Chemical Company" to --Hitachi Chemical Company, Ltd.--.

Signed and Sealed this

Twenty-third Day of March, 1999

*Attest:*

Q. TODD DICKINSON

*Attesting Officer*   *Acting Commissioner of Patents and Trademarks*